(12) United States Patent
Koblenz et al.

(10) Patent No.: US 8,842,433 B2
(45) Date of Patent: Sep. 23, 2014

(54) ENVIRONMENTAL CONTROL FOR MODULE HOUSING ELECTRONIC EQUIPMENT RACKS

(75) Inventors: Brian D. Koblenz, Seattle, WA (US); Carol Simon, Apex, NC (US); Milton P. Hilliard, Hillsborough, NC (US)

(73) Assignee: Cisco Technology, Inc., San Jose, CA (US)

( * ) Notice: Subject to any disclaimer, the term of this patent is extended or adjusted under 35 U.S.C. 154(b) by 399 days.

(21) Appl. No.: 13/299,022

(22) Filed: Nov. 17, 2011

(65) Prior Publication Data
US 2013/0128455 A1    May 23, 2013

(51) Int. Cl.
*H05K 7/20* (2006.01)
*G05D 23/19* (2006.01)

(52) U.S. Cl.
CPC ........ *H05K 7/20836* (2013.01); *G05D 23/1917* (2013.01)
USPC .................. 361/696; 361/679.47; 361/679.49; 361/701; 454/184; 62/259.2

(58) Field of Classification Search
USPC ....................... 361/676–678, 679.46–679.54, 361/688–722, 752, 831
See application file for complete search history.

(56) References Cited

U.S. PATENT DOCUMENTS 7,752,858 B2 * 7/2010 Johnson et al. .................. 62/186
8,405,977 B2 * 3/2013 Lin ........................... 361/679.51
8,427,830 B2 * 4/2013 Absalom ....................... 361/691
8,498,114 B2 * 7/2013 Martini .......................... 361/695
2004/0217072 A1 * 11/2004 Bash et al. ....................... 211/26

OTHER PUBLICATIONS

U.S. Appl. No. 13/029,450, filed Feb. 17, 2011, entitled "Performance Optimization in Computer Component Race," Inventor[s]: Brian Koblenz, et al.
Raghupathy, Arun P., et al., "Innovative Rack—Level Cooling Solutions," Huawei Symposium, Palo Alto, CA, Jul. 15, 2009; 47 pages http://www.ecooling.com/cms/spaw/pub/Innovative_Rack_Cooling_Solutions.ppt.
"Server Rack Cooling Strategies for Your Data Center," 42U Data Center Design, Copyright 2001 42U; 3 pages; http://www.42u.com/rack-level-cooling.htm.

* cited by examiner

*Primary Examiner* — Courtney Smith
(74) *Attorney, Agent, or Firm* — Patent Capital Group

(57) ABSTRACT

A system is provided in one example embodiment that includes at least one rack for electronic equipment, each rack including: at least one sensor configured to measure an environmental condition, an air conditioning system, an ingress port configured to allow air to flow into a corresponding rack from an environment surrounding the racks, and an egress port configured to allow air to flow out of a corresponding rack and into the environment surrounding the racks. The system also includes a housing that surrounds the racks and that defines the environment surrounding the racks. The air that flows out through the egress ports of the racks conditions the air in the environment surrounding the racks.

20 Claims, 6 Drawing Sheets

ENVIRONMENTAL CONTROL FOR MODULE HOUSING ELECTRONIC EQUIPMENT RACKS

TECHNICAL FIELD

The present disclosure relates generally to environmental controls for electronic equipment and, more specifically, to environmental control for module housing electronic equipment racks.

BACKGROUND

Data centers include a large number of computer components to store and process data (e.g., server equipment, data storage equipment, networking equipment, etc.). In recent years, data centers have undergone changes with regard to how the centers can be constructed, organized, and managed. In particular, recent developments in data centers employ a modular design in which racks that house computer components are arranged within modules, which may be environmentally sealed. This design maximizes computing capacity, while at the same time minimizing the space requirements for the hardware. Providing large numbers of computer components in a module presents a number of challenges, including providing proper ventilation and cooling systems that optimize the performance of the computer components.

DETAILED DESCRIPTION OF EXAMPLE EMBODIMENTS

Overview

A system is provided in one example embodiment and includes at least one rack for electronic equipment, each rack including: at least one sensor configured to measure an environmental condition, an air conditioning system, an ingress port configured to allow air to flow into a corresponding rack from an environment surrounding the racks, and an egress port configured to allow air to flow out of a corresponding rack and into the environment surrounding the racks. The system also includes a housing that surrounds the racks and that defines the environment surrounding the racks. The air that flows out through the egress ports of the racks can condition the air in the environment surrounding the racks. Note that the 'term' rack is broad, as it can encompass any type of structure (e.g., molded plastic, metal, chassis, cabinet, etc.) used in conjunction with electronic devices, equipment, infrastructure, etc.

In specific implementations, a size of the egress ports is adjustable. In addition, the egress ports can comprise a variety of apertures. In certain instances, the egress ports on a number of the racks may be closed to force airflow through a limited number of racks. Note that the term 'port' is a broad word that may include any type of vent, air escape structure, slit, hole, void, or opening. Separately, the terms 'egress' and 'ingress' are simply suggestive of a direction of air, but both terms include bidirectional air flow capabilities. At least some of the racks can contribute different amounts of cooling to the environment surrounding the racks. The system may also include an environmental control system configured to increase a cooling power for a corresponding rack when an associated egress port is made larger. The air conditioning system may include at least one air mover and a coolant flow conduit.

The environmental control system may be configured to monitor environmental conditions, and to adjust an egress port based on the environmental conditions that were monitored. The ingress ports can be provisioned on top of their respective racks and are configured to be open by default. A size of the ingress ports is adjustable. In addition, the air conditioning system can be configured to produce a cooling power, which can be increased when an associated ingress port is made larger. In more specific implementations, the ingress ports on a number of the racks may be closed, forcing a limited number of racks to cool the environment. The egress ports can be provisioned at the bottom of their corresponding racks.

Example Embodiments

Figure 1:
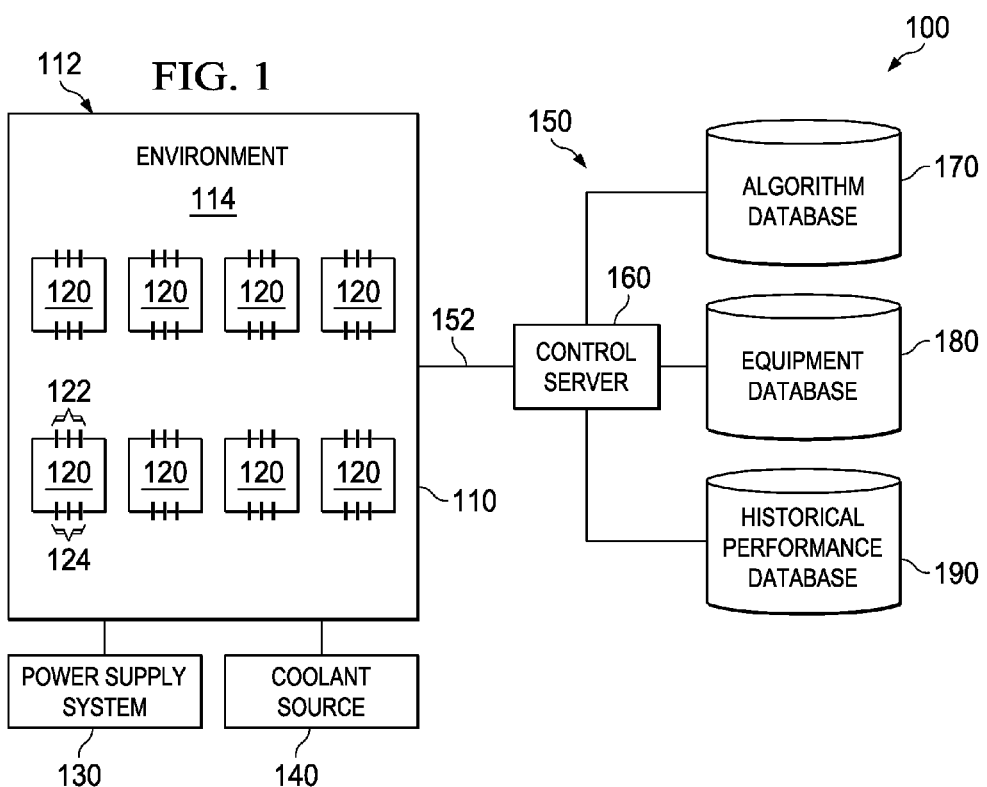
FIG. 1 is a block diagram illustrating an example system for providing environmental control for a module housing electronic equipment racks.

FIG. 1 illustrates an example system 100 for providing environmental control for a module 110, which houses racks 120 of electronic equipment. Module 110 may include a housing 112 that provides an enclosed structure to house racks 120, which may vary in number according to application. Housing 120 may provide an environment 114 that is substantially sealed from the outside environment. Thus, housing 120 may have minor, if any, air leaks. The term 'housing' is broad and, therefore, includes any type of structure that can be provisioned to store, protect, encompass, contain, or otherwise surround one or more racks. In particular implementations, module 110 may be associated with a containerized data center. Thus, module 110 may be a portable housing (e.g., a shipping container) configured to surround racks 120. In certain implementations, module 110 may be a building (e.g., portable or fixed).

Each rack 120 may include one or more pieces of electronic equipment that are secured within the rack in a suitable manner (e.g., by stacking the components within the racks). The electronic equipment stored within racks 120 may, for example, be any form of hardware associated with processing, storage, and/or communication of data including, without limitation, server equipment, data storage equipment, networking equipment, etc.

System 110 may include a power supply system 130 and a coolant source 140. Power supply system 130 couples to module 110 to provide electrical power for operation of the various pieces of electronic equipment, as well as other devices, within the module. Coolant source 140 is also coupled to module 110 and provides a source of coolant (e.g., water, glycol, refrigerant, etc.) for temperature control within racks 120, which will be described in more detail below. In certain implementations, power supply system 130 and/or coolant source 140 may be integrated with or even inside the module. Module 110 can further be configured to connect via a suitable communication link, whether wireline (e.g., local area network, wide area network, or optical) or wireless (e.g., IEEE 802.11, IEEE 802.16, or cellular), to other systems to facilitate transfer of data between the module and the other systems.

Each rack 120 may include an ingress port 122 and an egress port 124. Ingress ports 122 allow air to be drawn into racks 120 from environment 114 of module 110. Egress ports 124 allow air inside of racks 120 to be pushed into environment 114 outside of racks 120. Ingress ports 122 and egress ports 124 may be composed of one of more apertures (e.g., holes or slits) in the housings of racks 120. In certain example implementations, each egress port 124 may allow approximately 150 CFM of air to move through environment 114, which may provide approximately 1 KW-1.5 KW of potential cooling for the environment per-rack.

In particular implementations, egress ports 124 may be adjustable (e.g., automatically or manually) to alter the amount of airflow out of racks 120 and, consequently, the amount of airflow into environment 114. In some implementations, ingress ports 122 may be adjustable (e.g., automatically or manually) to alter the amount of airflow into racks 120 and, consequently, the amount of airflow out of environment 114. In certain implementations, both egress ports 124 and ingress ports 122 may be adjustable (e.g., automatically or manually) to alter the amount of airflow out of racks 120 into environment 114 and the amount of airflow into racks 120 from environment 114. Additionally, the environmental systems in the racks may be adjusted along with the egress ports and/or ingress ports.

Racks 120 may be coupled via a suitable communication link 152 with an environmental control system 150. Environmental control system 150 controls how and when components within module 110 are thermally managed based on different algorithms, which can be set by policies associated with particular module/rack configurations or other scenarios. Racks 120 may be coupled with environmental control system 150 via link 152 in any suitable manner to facilitate transfer of information between the two systems. Examples of the link between module 110 and environmental control system 150 include, without limitation, a local area network, a wide area network (e.g., the Internet), any one or more wired and/or wireless links, etc.

In this example implementation of FIG. 1, environmental control system 150 may include a control server 160 that communicates with one or more local controllers and/or sensors disposed within racks 120 and module 110 and associated with air conditioning systems configured to cool electronic equipment within racks 120. Server 160 is further coupled with one or more databases 170-190 that provide information relating to providing temperature control to electronic equipment in module 110. In the example implementation, information relating to control algorithms for providing temperature control to local controllers associated with the racks 120 is stored in an algorithm database 170, information relating to the electronic equipment in racks 120 is stored in an equipment database 180, and information relating to historical performance of the electronic equipment is stored in historical performance database 190.

Although the information is illustrated as being distributed between three databases, this is done merely for the convenience of discussion. Thus, the information may exist in one or more databases. In addition, while environmental control system 150 is shown as being coupled with a single module 110, it should be understood that environmental control system 150 could also be coupled with a plurality of modules (located in one or more geographic locations).

Environmental conditions may be controlled within racks 120 and within module 110 utilizing environmental control algorithms that are stored within algorithm database 170. The environmental control algorithms may be based on different criteria or policies to be implemented for a particular rack design and/or particular specifications for a rack and/or different conditions. The system may facilitate implementation of an environmental control algorithm (via control server 160 and/or rack controllers) for all racks 120 within module 110 or, alternatively, implementation of different environmental control algorithms for different racks 120 within the module to provide individualized and separate environmental control (e.g., control of temperature conditions, pressure conditions, humidity conditions, air flow rate conditions, etc.) for two or more racks or two or more sets of racks within the module.

Information about the electronic equipment provided in each rack may be stored within equipment database 180, and this information may be utilized by control server 160 and/or each rack controller in combination with certain environmental control algorithms to be applied to a particular rack. Examples of information stored within equipment database 180 include, without limitation, a listing of electronic equipment and where each is located within a specific rack 120, the computational and storage load ratings for each computer component, the redundancy and reliability requirements for each computer component (which can be used to provide a priority ranking for maintaining a particular computer component within a desired temperature range to optimize its performance), etc.

Control server 160 and/or the rack controllers can also use, in combination with the environmental control algorithms, information stored in a historical performance database 190. The information in historical performance database 190 may include historical information regarding measured and recorded changes in environmental conditions (e.g., temperature changes, air pressure or airflow rate changes, etc.) over selected time periods within specific racks that include specific types of computer components. Examples of measured and recorded changes in environmental conditions within specific racks can result from a number of scenarios, such as a change in the workload for one or more computer components within a specific rack over a given time period (e.g., one or more computer components in a specific rack have a history of an increased workload during certain time periods within a day, a week, a month, etc.), and a change in ambient temperature within module 110 (e.g., a change in average ambient temperature between spring, summer, fall and winter seasons). Based on this historical information for specific racks, control server 160 and/or the rack controllers can establish a predictive model of the air conditioning requirements (e.g., cooling or warming) for a certain time period that enhances the environmental control algorithm utilized to thermally treat a particular rack.

Thus, environmental control system 150 and/or the rack controllers utilize any one or combination of: (a) direct sensor measurement feedback based on environmental conditions within a rack (including temperature measurements at specific locations within the rack, calculated temperature gradients within the rack based on temperature measurements from two or more sensors within the rack, air pressure measurements at one or more locations within the rack, air flow conditions at one or more locations within the rack, and humidity measurements within the rack); (b) measured workloads from electronic equipment within the rack; (c) known performance characteristics of electronic equipment within the rack; (d) historical performance information that is available for the rack; and (e) other conditions that are not directly measured within or not directly associated with the rack (e.g., geographic environmental conditions in which the module is located, policy changes to a particular rack or the module) to enhance cooling, temperature and/or other types of environmental control within the rack thereby optimizing performance of the computer components within the rack.

Since the temperature and other environmental conditions required for optimizing performance characteristics for one rack can differ from another rack (e.g., due to the number and/or types of computer components that differ between each rack), control server 160 and/or each individual rack controller can implement different environmental control algorithms for providing separate and individualized controlled environmental conditions within each rack. Environmental control system 150 and/or each individual rack controller can further dynamically change an environmental control algorithm implemented for a particular rack based on a change in the measured data associated with the rack. In addition, electronic equipment within a rack can be controlled separately based on different environmental control algorithms applied to the electronic equipment (e.g., by adjusting air mover operational speeds differently within the same rack based on the location of the electronic equipment with respect to particular components and the types of environmental control to be applied to such electronic equipment).

The types of environmental control algorithms that can be applied to a particular rack or module may depend upon a number of factors including, without limitation, the rack design and desired performance characteristics of the electronic equipment within the rack, the geographic location of the module, whether there are external factors that influence environmental control for the rack or module based on higher level policies, etc. Some general and non-limiting examples of criteria to be incorporated within environmental control algorithms to implement within a rack are as follows:

1. Controlling coolant temperature, coolant flow, and/or the speed of one or more air movers for the rack to establish and maintain a selected temperature, humidity level, air pressure and/or air flow rate at one or more locations within the rack and/or to establish and maintain a selected gradient between at least two temperature sensors within the rack (e.g., a _T value between a hot aisle temperature and a cold aisle temperature within the rack). For example, in response to a measured _T value within the rack rising above a threshold value, the algorithm implements an increase in one or more air mover operating speeds, an increase in the coolant flow rate (by adjusting a valve) and/or decreasing the temperature of the coolant flowing within a rack.

2. As the measured workloads decrease for one or more electronic components within a rack below a lower threshold value, an algorithm may implement a decrease in the flow of coolant and/or the operating speed of one or more air movers for the rack. In contrast, when the measured workloads for one or more electronic components increases within the rack above an upper threshold value, the algorithm may implement a corresponding increase in the flow of coolant and/or operating speed of one or more air movers.

3. When it is determined that one or more electronic components within a rack is not operating (e.g., when a server management system disposed within a rack is in a shutdown mode), an algorithm may implement a shutdown of the coolant system and air movers. This determination can be made, for example, based on feedback from the workload sensor(s) for the rack that indicates no power or a minimal amount of power has been supplied to the electronic equipment within the rack over a selected amount of time.

4. Historical environmental control data for a rack can be established over a certain operational time period, where such historical data is stored within historical performance database 190. An algorithm may utilize this historical performance data to implement suitable adjustments to air mover operating speeds, coolant flow rates, and/or coolant temperature and/or flow rate set points. For example, the historical performance data for a particular rack can indicate that, when an workload for one or more computer components and/or when a measured temperature gradient within the rack exceeds a certain threshold value, operating speeds for one or more air movers and/or coolant flow rate should be increased. The historical performance data can also provide specific set points (e.g., specific coolant valve adjustments and/or specific adjustments to the operating speed of one or more air movers) for the rack that are known to result in an efficient cooling within the rack which results in establishing an acceptable temperature gradient and/or which optimizes performance of the electronic equipment disposed therein.

5. Utilizing known performance information, acquired from equipment database 180, an algorithm may implement environmental control that is tailored to the specific electronic equipment within a particular rack. For example, if the specifications for a particular server within the rack, which are accessible from equipment database 80, indicate that optimal performance conditions for a particular server are within a specified temperature range, the algorithm may implement control of the air mover operating speeds and/or coolant flow rate to achieve a set point temperature within the rack that is close to or within the specified temperature range for the server. The algorithm can further implement control of the air movers and coolant system to achieve a desired temperature gradient within the rack.

6. An algorithm can be implemented to monitor when an internal fan of one or more pieces of electronic equipment is operating. Many computer components, such as servers and storage databases, have cooling fans incorporated within the housing of the component to provide cooling within the component. Additional sensors can be implemented within the rack that are coupled with electronic equipment to provide an indication to control server 160 and/or rack server regarding when an internal cooling fan of one or more computer components is running. The algorithm may implement an integrated use of the rack air movers with the internal cooling fans of the electronic equipment to minimize overall power consumption for the rack. For example, when a rack sensor provides an indication that an internally mounted fan within a particular piece of electronic equipment is running, the operating speed of one or more rack air movers that are in close proximity to this electronic equipment are adjusted (e.g., the operating speed of an air mover can be decreased).

7. An algorithm can be implemented that utilizes measured information from one or more leak detection sensors within a particular rack, where an indication by such sensors of a leak results in a warning provided by control server 160 and/or a rack controller to a system operator that there is a potential problem with the cooling system of the rack. In addition, identification of other problems associated with the cooling system, such as a potential blockage in the conduit that prohibits or significantly reduces coolant flow, performance degradation in one or more air movers, etc., can be identified based on a comparison of current temperatures and temperature gradients within the rack vs. historical information for the rack under the same or similar workload conditions (available in historical performance database 190). Changes in airflow rates, which can be measured by airflow sensors within the rack, can also provide an indication of air mover degradation. Humidity sensors can further provide an indication when the airflow circulating within a rack has too much moisture (which could present problems with the operation of electronic equipment within the rack). When a problem is detected, control server 160 may provide a warning to the system operator.

8. Control server 160 and/or a rack controller can dynamically change environmental control algorithms implemented for a particular rack based on changing conditions. For example, an initial algorithm implemented for a rack may focus on achieving a set point temperature at a selected location (e.g., a hot aisle location) within the rack by adjusting (as necessary) air mover operating speeds and/or coolant flow rates within the rack. However, when the workload of a piece of electronic equipment within the rack exceeds a threshold value, a different algorithm may be implemented for the rack that utilizes known set points for the air movers and coolant flow system that are known to optimize electronic equipment performance based on historical performance information stored in historical performance database 190 for such workload levels associated with the rack.

9. An algorithm can be implemented to control environmental conditions within one rack or within a plurality of racks within a module based on conditions that are external to and do not directly influence the rack or module that is subject to environmental control. For example, an algorithm may be implemented based on an upper tier or upper level policy in which temperatures, pressures, airflow rates, and/or coolant flow rates are allowed to fall outside of certain set point ranges for a particular rack or a particular module for a select time period in order to devote resources (e.g., coolant flows, electrical energy requirements associated with cooling the rack or module) to another area (e.g., another rack or another module) due to a particular crisis (e.g., significant overheating within another rack or module). When the crisis is averted, an algorithm may be implemented to bring the rack or module within desired environmental conditions to ensure optimal performance of the computer components within the rack.

The above examples can be implemented alone, or in any selected combination with each other for a particular scenario.

Ingress ports 122 and egress ports 124 allow some of the cooling power of each rack 120 to be applied to environment 114 of module 110. Module 110 may, for example, be subject to varying conditions such as atmospheric conditions (e.g., hot or cold air temperatures, wind, rain, etc.) and solar load. Ingress ports 122 allow air from environment 114 to be drawn into racks 120. While inside the racks, the drawn-in air may be mixed with the air internal to the racks and modified (e.g., by temperature and/or humidity) along with the air internal to racks 120. Egress ports 124 allow a portion of the air that has been modified in the racks to be provided back to environment 114.

Racks 120 may contribute varying amounts of cooling power to environment 114. For example, all racks 120 may contribute an equal amount of cooling power. As another example, only a limited number of racks 120 may contribute cooling power to environment 120, with the other racks being isolated from environment 114 (e.g., by closing ingress ports 122 and/or egress ports 124).

In certain modes of operation, ingress ports 122 and/or egress ports 124 may be set to an appropriate level, and environmental control system 150 may adjust the environments in the racks to account for the setting of the ports and the demands internal to the racks, according to temperature settings already established for the electronic equipment therein. Additionally, as discussed in more below, in certain implementations the needs of environment 114 may be determined and then the racks having available cooling power to meet the needs may be identified, the ports of the identified racks may be set to appropriate levels, and the cooling power of the identified racks may be adjusted.

In some modes of operation, some of racks 120 may be used to cool a rack 120 that is not able to provide its own cooling (e.g., because it is being serviced) and, hence, adding its heat to the ambient environment. Thus, different racks 120 may contribute different amounts of cooling to environment 114.

Note that examples of typical cooling systems for computer components in a module include cooling the module uniformly, or using self-contained racks. Uniform cooling of a module is routinely accomplished by a single, centralized system that conditions air in the module environment outside the racks. These systems may do well at keeping the module environment at the prescribed conditions; however, self-contained racks can more directly cool the computer components contained therein. For example, racks can allow efficient cooling for electronic equipment by creating a relatively closed loop of airflow within the rack and enabling different racks to have different cooling strategies. While this may lead to efficient cooling, it does not provide a way to cool the ambient environment without providing supplemental cooling.

System 100 is configured to offer a variety of advantageous mechanisms for addressing these cooling scenarios. By intelligently adapting the racks, it is possible to cool both the electronic equipment and the module environment without supplemental cooling. Thus, the racks' air conditioning systems may provide the primary, or even the exclusive, way to control the environment in the module. Note that existing modular solutions do not use self-contained racks. They cool the module uniformly, but cannot separate cooling the electronic equipment from cooling the module environment. Thus, system 100 can offer a more efficient solution because it can target the cooling power to particular racks (and even electronic components), while still achieving environmental control for the module environment outside the racks (i.e., by using excess capacity of one or more racks). Moreover, by using the cooling power native to the racks, space may be conserved (or used for something else), environment 114 may be dehumidified, and the environment inside racks 120 may be humidified.

Although FIG. 1 illustrates one example of a system for controlling the environment of a module housing electronic equipment racks, other implementations may include fewer, additional, and/or a different arrangement of components. For example, a module many contain fewer and/or additional racks. As another example, the coolant source and/or the control system could be part of the module. Thus, a variety of operations (e.g., coolant pressure, coolant temperature, coolant flow rate, etc.) may be controlled by the module. As a further example, there may be no control system.

Figure 2:
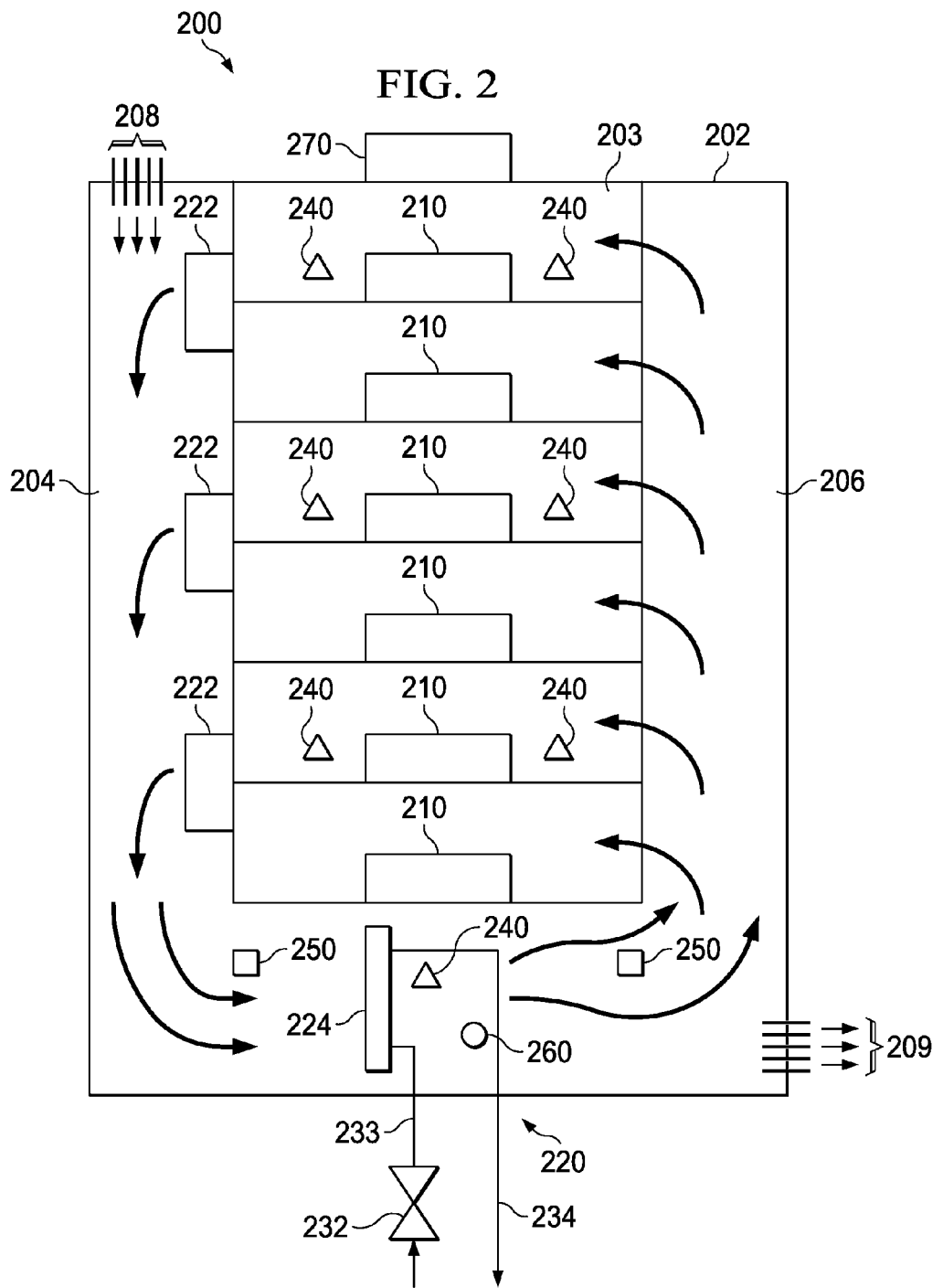
FIG. 2 is a schematic diagram of an example rack of electronic equipment.

FIG. 2 illustrates an example configuration of a rack 200 of electronic equipment. Rack 200 may include a housing 202, which may be composed of metal, plastic, composite, or any other appropriate material, and an air conditioning system 220. Housing 202 may provide a substantially sealed environment for electronic equipment 210. Electronic equipment 210 is housed in a stacked manner in an electronic equipment support portion 203 of rack 200. Support portion 203 may be a chamber, whether partially enclosed or not, a frame, or any other appropriate structure for supporting electronic equipment 210. The electronic equipment may, for example, be servers, data storage devices, networking devices, or any other appropriate form of hardware. When electronic equipment 210 is operating in certain modes, it may generate heat and need to be cooled.

Air conditioning system 220 may include a number of modules, including air movers 222 and coolant flow conduit 224. Air movers 222 may, for example, be circulating fans, blowers, or appropriate devices for creating airflow. Air movers 222 cause air to flow in a circuit through rack 200 to bring conditioned air (e.g., cool) toward electronic components 210. The arrows depicted in FIG. 2 show the airflow cooling circuit or airflow path that is generated by the air movers.

Although three air movers 222 are illustrated, it should be understood that any suitable number of units can be provided to achieve cooling within rack 200. In addition, while rack 200 is shown with electronic equipment 210 stacked and air movers 222 aligned in a vertical orientation, it should be understood that the rack can have any other suitable configuration (e.g., air movers and electronic equipment of the rack can be stacked or segregated in any horizontal, vertical and/or other alignments with respect to each other).

Air movers 222 may be configured to operate at altering speeds to selectively change the flow rate from their outlets. As shown in FIG. 2, air movers 222 are disposed within a hot aisle 204 of rack 200 and pull or draw air from support portion 203, which is located between hot aisle 204 and a cold aisle 206, and into hot aisle 204 (as shown by the arrows on the left in FIG. 2). Air movers 222 also force airflow through hot aisle 204 to a coolant flow conduit 224. Air flowing past coolant flow conduit 224 is directed into cold aisle 206, where it then flows back into support portion 203 (as shown by the arrows on the right in FIG. 2). In particular implementations, hot aisle 204, in which air movers 222 are located, can include a door that is pivotally movable away from equipment portion 203 in order to provide easy access to the air movers.

In particular implementations, air conditioning system 230 may produce approximately 24 KW of cooling power, which may be in excess of the normal requirement for cooling the electronic equipment in a rack. Other cooling powers levels may be provided in other implementations, which may have particular configuration needs and requirements.

Coolant flow conduit 224 provides heat exchange between a coolant (e.g., water) flowing through the conduit and the air directed from air movers 222 through hot aisle 204 toward and across the conduit (e.g., to lower the temperature of the air flowing from the air movers prior to flowing into cold aisle 206 and back into equipment portion 203 and toward electronic equipment 210). In particular implementations, coolant flow conduit 224 may be a heat exchanger or an evaporator coil.

Coolant flow conduit 224 is coupled to a coolant source, such as coolant source 140 in FIG. 1, and the coolant source provides the coolant at a selected temperature or within a selected temperature range to rack 200. Thus, air flowing within cold aisle 206 has been cooled by the coolant system, while air flowing through support portion 203 cools electronic equipment 210 and is drawn into the inlets of air movers 222. The warmer air that has been directed across electronic equipment 210 is again conveyed through hot aisle 204 and across coolant conduit 224 to cool the air prior to re-entering cold aisle 206. One or more valves (shown generally as valve 232 in FIG. 2) can also be provided to control the flow rate of liquid coolant through conduit 224 and between the rack inlet and outlet locations.

Housing 202 may include an ingress port 208 and an egress port 209. Ingress port 208 allows air on the outside of housing 202 to be drawn into rack 202. Egress port 209 allows air inside of housing 202 to be pushed into the environment outside of housing 202 (e.g., the module's environment). Ingress port 208 and egress port 209 may, for example, include a number of slits (e.g., a vent) or a number of apertures (e.g., perforations). In the illustrated implementation, ingress port 208 is located at the top of the housing, and egress port 209 is located at the bottom of the housing, but other locations for the ports are viable.

In particular implementations, egress port 209 may be adjustable (e.g., automatically or manually) to alter the amount of airflow out of rack 200 and, consequently, the amount of airflow into rack 200. In some implementations, ingress port 208 may be adjustable (e.g., automatically or manually) to alter the amount of airflow into rack 200 and, consequently, the amount of airflow out of rack 200. In certain implementations, ingress port 208 and egress port 209 may be adjustable (e.g., automatically or manually) to alter the amount of airflow out of rack 200 and the amount of airflow into rack 200. The adjustments can be done through increments in certain implementations.

Sensors 240 (e.g., temperature, pressure, humidity, etc.) are provided at suitable locations within equipment portion 203 and/or suitable locations in hot aisle 204 and cold aisle 206 to detect environmental conditions at various locations within rack 200. In particular implementations, sensors 240 may effectively measure temperature gradients that may exist within the rack. In some implementations, pressure sensors can also be provided at suitable locations to measure pressures and/or pressure gradients within rack 200 (e.g., to determine whether there are stagnant or stalled airflows within equipment portion 203). In addition, coolant conduit 224 may include one or more sensors 240 to measure the temperature of the liquid coolant at an inlet location 233 of the rack, at an outlet location 234 of the rack, and/or internal to the rack.

Humidity sensors 250 may also be provided at one or more suitable locations within rack 200 (e.g., at one or more locations proximate coolant conduit 224) to measure humidity levels of the air circulating within the rack. The combination of temperature, pressure, and humidity measurements within the rack may facilitate the monitoring and control of environmental conditions within the rack.

One or more leak detection sensors (indicated generally as element 260 in FIG. 2) may also be provided within rack 200 at one or more suitable locations to identify whether conduit 224 is leaking coolant during operation of electronic equipment within the rack. In particular implementations, leak detection sensor 260 is disposed within the rack, while flow valve(s) 232 for coolant conduit 224 are disposed external to the rack to ensure coolant flows are prevented from flowing within the rack in the event a coolant leak is detected.

Other types of sensors (including, without limitation, airflow sensors) can also be provided at suitable locations within rack 200 to assist in monitoring environmental conditions within the rack and enhance temperature control by controlling the air movers and coolant flow system during system operation. Temperature sensors, humidity sensors, pressure sensors, leak detection sensors, and other types of sensors provided within the rack can be of any one or more conventional or other suitable types.

In addition, sensors may be provided to measure the processing workload of electronic equipment 210 within rack 200. One or more sensors can be provided for a rack to monitor the workload individually for each piece of electronic equipment 210 within the rack, to monitor the workload for selected sets or groups of electronic equipment within the rack, or to monitor the entire or collective workload of the electronic equipment within the rack.

For example, power consumption sensors may be provided to measure the electrical power requirements for electronic equipment within the rack continuously or over any selected time period, and this may provide an indication of the degree at which computer components are processing data (and thus generating heat) within the rack. However, other types of sensors can also be utilized to measure the workload for electronic equipment within the rack (e.g., central processor unit loading and/or other types of sensors or detection systems that monitor the transfer and/or processing of data in relation to a particular component, that monitor the activity of processors and/or other subcomponents within the computer components, etc.).

Direct control of the operation of air movers 222 and the coolant flow system can be achieved via local controllers (e.g., computers) associated with each rack, where the local controllers communicate (e.g., via a link like communication link 152) with a computer system of an environmental control system. For example, as shown in FIG. 2, rack 200 may include a controller 270 that communicates with the various rack sensors and provides temperature and/or other environmental control within the rack, by controlling operation of air movers 222 and the coolant flow system for the rack based on a particular algorithm assigned to the rack. Controller 270 may implement an algorithm (e.g., by accessing a control algorithm from a database) for controlling the air movers and coolant flow system to provide environmental control (e.g., temperature control, pressure control, humidity control, air and/or coolant flow rate control, etc.) within the rack that is independent and separate from other racks in a module. In this configuration, controller 270 can provide direct environmental control within a rack 200, while a control server provides an upper level or upper tier of environmental control to one or more racks 200 based on implemented and/or changing policies associated with the racks 200 or a module. In some implementations, an environmental control computer can be configured to provide direct environmental control within each rack by controlling operation of the air movers and coolant flow system assigned to each rack.

Control of air movers 222 may include adjusting the operational speeds in implementations in which the air movers have variable speeds. Control of the coolant flow system may include adjusting valve 232 to adjust coolant flow rate through conduit 224 between inlet 233 and outlet 234, and also adjusting a temperature of the coolant within the coolant flow system at a location prior to entering the rack inlet 233 (e.g., by controlling operation of a coolant source).

As previously described, each module may include one or more racks. The design of each rack, including locations, number, and different types of sensors associated with each rack, may provide detailed information regarding environmental conditions within individual racks as well as workload conditions for electronic equipment at any selected time period within individual racks. Some or all of this information may be provided to rack controllers 270 and can also be provided to an environmental control system. The environmental control system and/or each controller 270 associated with each rack 200 may be configured to provide independent temperature control as well as independent control of other environmental conditions (e.g., air pressures, humidity levels, etc.) for each individual rack within a module based on the measured environmental conditions within each rack (e.g., air and coolant temperature conditions, humidity levels, workloads on computer components, etc.).

Figure 3:
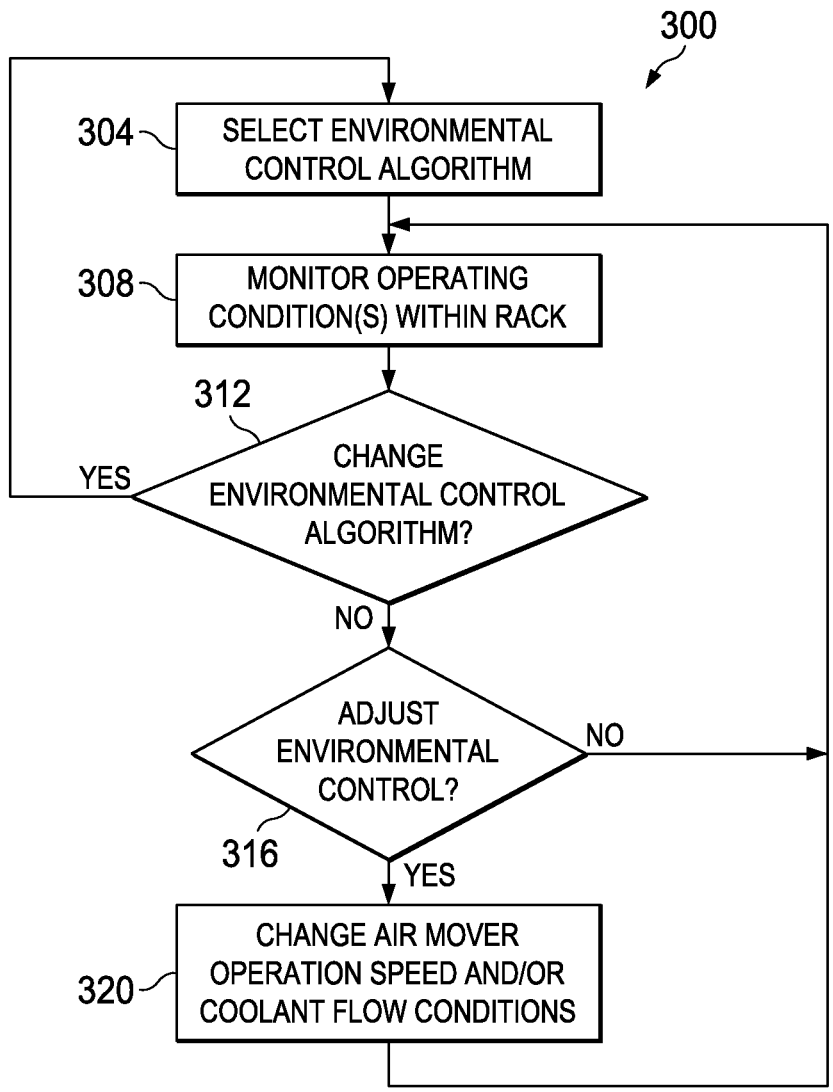
FIG. 3 is a flowchart illustrating an example process for providing environmental control for a rack of electronic equipment.

FIG. 3 illustrates an example process 300 for implementing environmental control within a rack disposed within a module. The environmental control may, for example, be implemented using an environmental control system like environmental control system 150 and/or a rack controller (e.g., rack controller 270). Thus, the example process can be independently and separately implemented for each rack within a module.

This particular flow may begin by selecting an environmental control algorithm (operation 304). The algorithm may, for example, be selected from an algorithm database like database 170 and may control temperatures within the rack based on any one or combination of different criteria, such as the types of previously described criteria. The environmental control algorithm can further utilize information from one or both of an equipment database and a historical performance database in order to implement the algorithm. This particular flow may also include monitoring one or more operating conditions within the rack based on measured information from sensors (operation 308). The operating conditions may, for example, be monitored based by a control server and/or a rack controller.

A subsequent activity may include determining whether to change the environmental control algorithm based on an operating condition within the rack (operation 312). The determination may be made by a server and/or a rack controller and may, for example, be based on an operating condition falling outside of a selected range or based on an operating condition that is external to the rack (e.g., based on an upper level policy to be implemented based on a condition that is not measurable within the rack). For example, if a workload for electronic equipment suddenly increases above a threshold value, the server and/or the rack controller may determine that such a sudden change requires a change in the approach for cooling the rack, where historical information associated with workloads for the electronic equipment may be needed to assist in developing an effective algorithm to optimize cooling and performance of the electronic equipment within the rack.

If a change in algorithm is required, then the flow may include selecting another environmental control algorithm for implementation in controlling environmental conditions within the rack (operation 304). The selection may be made by the server and/or the rack controller.

If no change in the environmental control algorithm is necessary, then the flow may include determining whether an environmental control adjustment is necessary based on the measured operating conditions (operation 316). The determination may be made by a server and/or a rack controller. If an environmental control adjustment is needed, the flow may include effecting a change in the operational speed of one or more air movers and/or a change in the coolant flow conditions (e.g., changing the coolant flow rate) (operation 320). The change may be effected by a server and/or the rack controller. Process 300 then continues with monitoring operating conditions within the rack (operation 308).

Figure 4:
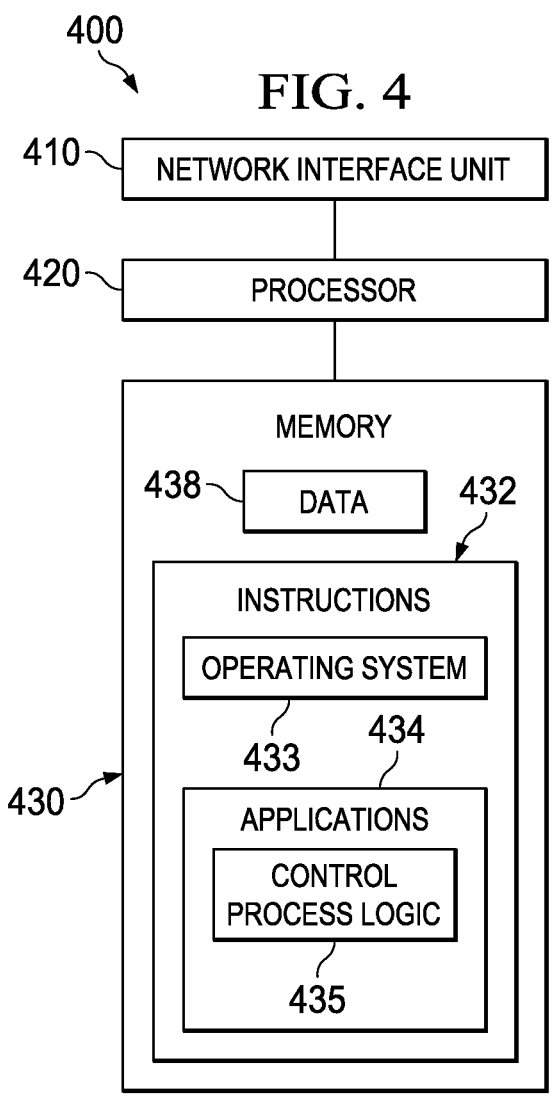
FIG. 4 is a block diagram illustrating an example computer system for providing environmental control for a rack of electronic equipment.

FIG. 4 illustrates an example computer system 400 for performing environmental control for a module housing electronic equipment racks. Computer system 400 may, for example, be similar to control server 160 of system 100 or controller 270 of rack 200. Computer system 400 may include a network interface unit 410, a processor 420, and a memory 430. Network interface unit 410 may, for example, be a network interface card (whether wireline or wireless), a modem, a switch, or any that device that allows communications over a communication link. Processor 420 may be a microprocessor, a microcontroller, or any other device that manipulates data in a logical manner. Processor 420 may operate according to instructions stored in memory 430.

Memory 430 may be read only memory (ROM), random access memory (RAM), magnetic disk storage media devices, optical storage media devices, flash memory devices, and/or other devices for storing information. Memory 430 may include instructions (e.g., software and/or firmware) 432 and data 438. Instructions 432, which are executed by processor 420, include an operating system 433 (e.g., Window, UNIX, of Linux) and applications 434. Applications 434 include control process logic 435. The control process logic, when executed by processor 420, causes the processor to perform environmental control operations. For example, the processor may perform operations similar to those described for process 300. Thus, the processor and the control process logic as shown in FIG. 4 may facilitate implementation of environmental control algorithms to control air movers and/or an air conditioning system for a module in response to measured conditions associated with the racks (e.g., obtained by information communicated to a rack controller or a control server by the various sensors associated with the rack) or external conditions that may affect the type of control algorithm to be applied to each rack. Data 438 stores information required for and generated by application 434.

In certain implementations, environmental control algorithms can be implemented, managed, and/or changed via a control server (e.g., control server 160), a computer system (e.g., computer system 400), a rack controller (e.g., rack controller 270), an environmental control system (e.g., environmental control system 150), or any suitable combination of these elements. As used herein end this Specification, the broad term 'control element' encompasses all of these possible device and choices. In addition, and in the context of other embodiments, such control elements may further include a router, a switch, a gateway, a proprietary device, a network appliance, a bridge, a console, a telephone, a computer, a personal digital assistant (PDA), a laptop or electronic notebook, an i-Phone, an iPad, a Google Droid, any other type of smartphone, or in any other suitable electronic device, component, etc.

In an example implementations, each rack controller can access databases or an environmental control system (e.g., via communication link) and apply an environmental control algorithm to the rack. Changes to the algorithm can also be implemented by the rack controller based on changing operating conditions within the rack or a condition that is external to the rack (i.e., a condition that is not measurable within or associated with the rack).

In some implementations, a control server can function as an upper tier or upper level management controller that provides algorithms to individual rack controllers and implements changes in an environmental control algorithm to a particular rack based on an external condition. Thus, a rack controller can be configured to implement operation of the selected algorithm locally by controlling the air movers and/or an air conditioning system accordingly, while the control server implements upper level control on each rack based on policies to be applied to a particular rack.

The methods and systems described herein can offer individualized, dynamic, and efficient cooling and/or other environmentally controlled conditions for electronic equipment within rack systems based on sensor readings within racks, workloads, historical temperature control information, and/or performance specifications for the electronic equipment. This allows for finer grained power optimization for controlling temperature in comparison to traditional temperature control systems, particularly when utilized in modular data centers incorporating a large amount of electronic equipment in multiple rack structures. The methods and systems further allow for remote environmental control within racks, where the environmental control can be independently and separately implemented for different racks and also based on separate policies associated with different racks (or different modules containing multiple racks).

Hence, the cooling activities discussed herein can be executed via one or more memory elements, which can store data used for the activities described herein. This includes the memory being able to store instructions (e.g., software, logic, code, etc.) that are executed to carry out the activities described in this Specification. A processor can execute any type of instructions associated with the data to achieve the operations detailed herein in this Specification. In one example, the processor could transform an element or an article (e.g., data) from one state or thing to another state or thing. In another example, the activities outlined herein may be implemented with fixed, non-transitory logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

Figure 5:
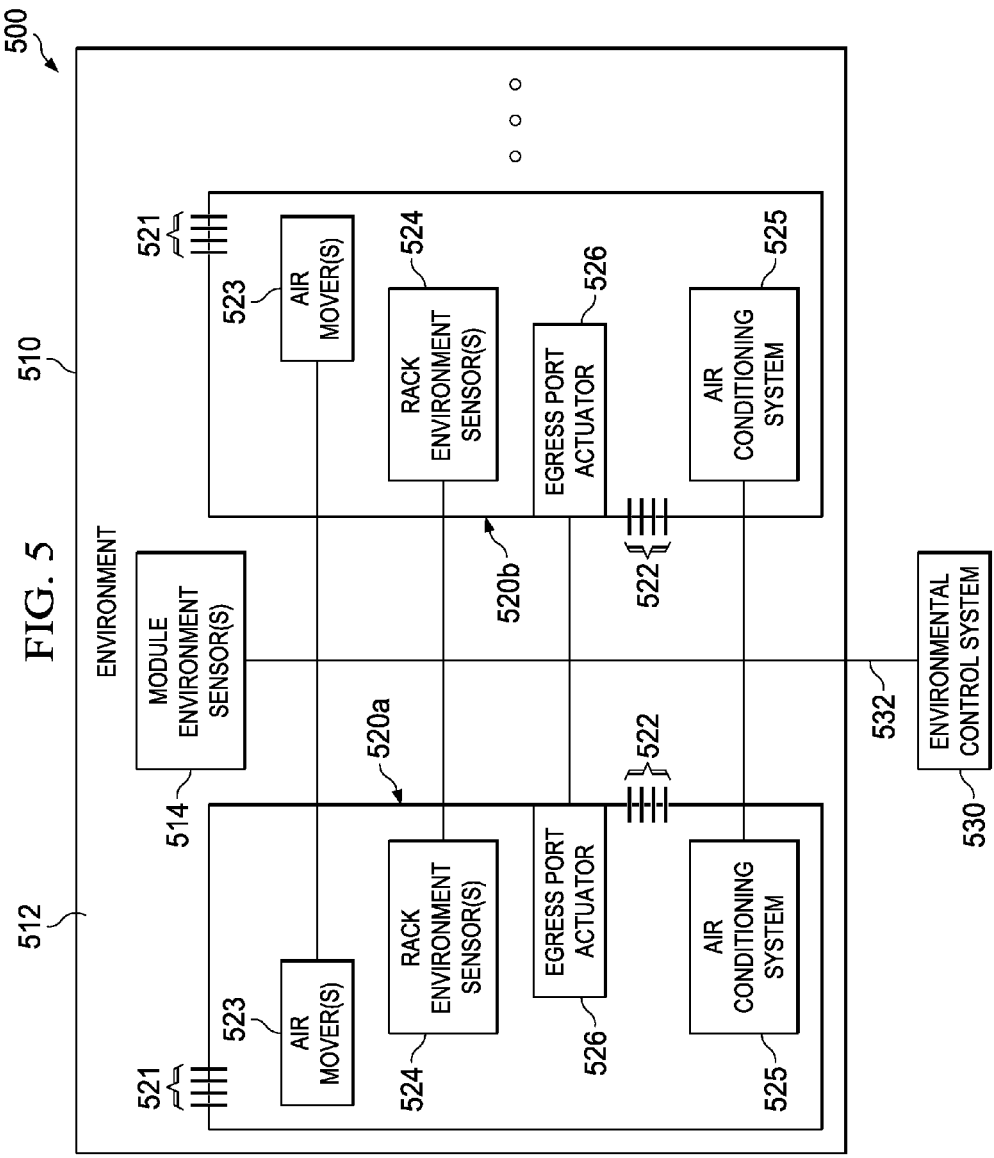
FIG. 5 is a block diagram illustrating an example control system for providing environmental control for a module housing electronic equipment racks.

FIG. 5 illustrates an example system 500 for providing environmental control for a module 510 housing racks 520 of electronic equipment. As illustrated, module 510 may include two racks 520, but this is primarily for purposes of discussion. Thus, module 510 may contain any number of racks 520. Each rack 520 may include ingress port 521 and egress port 522 to allow airflow from and to, respectively, the environment 512 of module 510 outside of racks 520. As mentioned earlier, ingress port 521 and/or egress port 522 may be composed of one or more holes (e.g., apertures or slits). Also as a part of system 500, each rack 520 may include one or more air movers 523, one or more environment sensors 524 (e.g., possibly associated with various pieces of electronic equipment), an air conditioning system 525, and an actuator 526 for egress ports 522. Air mover(s) 523 may, for example, be a fan or a blower, and sensor(s) 524 may measure temperature, pressure, and/or humidity.

Air conditioning system 525 may, for instance, include a condenser coil, which may serve to dehumidify the air from environment 512 (e.g., due to vapor condensing on the coil) as well as cooling the air. The coolant may be fed to air conditioning system 525 by an external system. Actuator 526 may, for example, be an electro-mechanical device (e.g., a solenoid, a worm drive, or a spline drive) that moves a cover (e.g., a plate or rotatable slats) over port 522.

System 500 also may include one or more sensors 514 for environment 512 and a control system 530. Sensor(s) 514 may, for example, measure temperature, pressure, and/or humidity in environment 512, and control system 530 may be a computer system. Control system 530 may, for example, be similar to computer system 400. In certain implementations, control system 530 may be a distributed computer system, for example, having an instance of environmental control system 150 and rack controllers 270. Control system 530 may communicate with air movers 523, rack sensor(s) 524, egress port actuators 526, air conditioning system 525, and module sensor(s) 514 via a communication link 532. Communication link 532 may, for example, be a bus, a LAN, a WAN, or a wireless link.

In certain modes of operation, control system 530 may, among other things, monitor environmental conditions in electronic equipment racks 520 using sensors 524. Based on this monitoring, the control system may determine whether the environment in one or more electronic equipment racks 520 is unacceptable. The environment in a rack may, for example, not be acceptable if an environmental condition is out of an acceptable range (e.g., if it deviates more than 10% from a set point). If the environment in one or more racks is not acceptable, control system 530 may determine adjustment(s) for an environmental control for the affected rack(s). For instance, if the electronic equipment in a rack is too hot, the airflow around the electronic equipment may be increased and/or the temperature of the coolant that cools the air may be decreased. As another example, if the humidity is too high, the air mover speed may be lowered to cause a longer run time and decrease the humidity. A command may be generated based on the determined adjustment and sent to the appropriate component (e.g., one or more of air movers 523 or one or more of air conditioning systems 525) over communication link 532.

Control system 530 may also monitor environmental conditions in module 510 using sensor(s) 514. Based on this monitoring, the control system may determine whether the environment in the module is acceptable. The environment in the module may, for example, not be acceptable if an environmental condition is out of an acceptable range. If the environment in the module is acceptable, the control system may continue to monitor the operating conditions in the racks and the module.

If, however, the environment in the module is not acceptable, the control system may determine whether there are any racks available to perform an adjustment to the module environment. For example, if the module environment is too hot, the air conditioning systems of the racks may be evaluated to determine which, if any, have extra cooling capacity. If no racks have the ability to perform an adjustment to the module environment, the control system may continue to monitor the operating conditions in the racks and the module. Thus, cooling power may be prioritized for the racks over the module environment.

If, however, one or more racks are available to perform an adjustment to the module environment, the control system may select the rack(s). For instance, if a number of racks are available to perform an adjustment, the rack(s) that have the largest current excess capacity may be used. In particular implementations, the scheduled use of the electronic equipment in the racks may also be taken into account. For example, if the workload of a rack is expected to increase soon (e.g., based on historical data), it may not be selected. In certain modes of operation, multiple racks may be used to provide the adjustment.

Once the appropriate rack(s) have been selected, the control system may determine an adjustment for the rack(s) egress port. The appropriate adjustment may, for example, be to increase the size of the egress port (e.g., if the module environment is too hot) or to decrease the size of the egress port (e.g., if the module environment is too cold). A command may be generated based on the adjustment and communicated to the appropriate actuators 526 over communication link 532.

The control system may also determine an adjustment for the environmental controls for the selected rack(s). For instance, if an egress port is being made larger (e.g., because the module environment is too hot), the cooling power in the rack may be increased (e.g., by increasing airflow and/or decreasing coolant temperature). Increasing the cooling power to the module by opening the egress port may, for example, reduce the cooling power for the electronic equipment in the rack. As another example, if the egress port is being made smaller, the cooling power in the rack may be decreased. Decreasing the cooling power to the module by reducing the size of the egress port may, for example, increase the cooling power for the electronic equipment in the rack. The adjustment to the environmental control(s) for the selected rack(s) may be communicated to the appropriate computer through an electronic command over communication link 532. The control system may then continue monitoring the operating conditions in the racks and the module. Thus, the amount of ambient cooling contributed by a rack to the module environment may be dynamically varied.

Although system 500 illustrates an example system for providing environmental control for a module housing racks of electronic equipment, other systems for providing environmental control for a module housing racks of electronic equipment may include fewer, additional, and/or a different arrangement of components. For example, certain systems may include actuators for ingress ports 521. By controlling the ingress ports, control system 530 may control the amount of air flowing into module environment 512 and thereby altering the environment. In particular implementations, actuators may be included for both the ingress ports and the egress ports, and the control system may control both set of actuators. As another example, some implementations may allow the control system to control a coolant source (e.g., to adjust coolant temperature or flow rate). As a further example, in some implementations, the control system may be internal to module 510.

Figure 6:
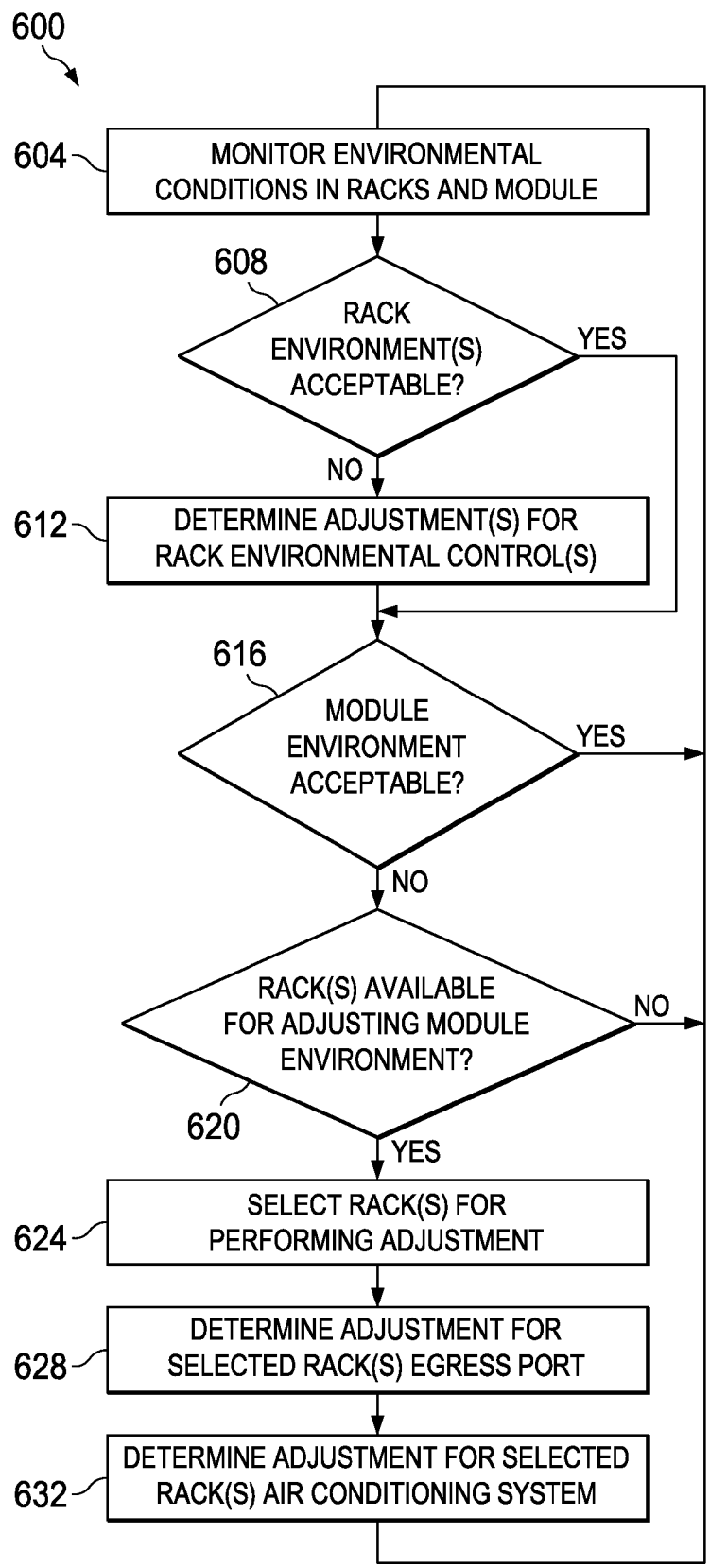
FIG. 6 is a flowchart illustrating an example process for providing environmental control for a module housing electronic equipment racks.

FIG. 6 illustrates an example process for controlling the environment of a structure housing electronic equipment racks. Process 600 may, for example, be implemented by a control system like control system 530 of system 500. This particular flow may include monitoring environmental conditions in electronic equipment racks and a module housing the racks (operation 604). The conditions (e.g., temperature, pressure, and/or humidity) may, for example, be monitored by one or more sensors located in the module and the racks.

This particular flow may also include determining whether the environment in one or more electronic equipment racks is acceptable (operation 608). The environment in a rack may, for example, not be acceptable if an environmental condition is out of an acceptable range (e.g., if it deviates more than 10% from a set point). If the environment in one or more racks is not acceptable, then the flow includes determining adjustment(s) for an environmental control for the affected rack(s) (operation 612). For instance, if the electronic equipment in a rack is too hot, the airflow around the electronic equipment may be increased and/or the temperature of the coolant that cools the air may be decreased. As another example, if the humidity is too high, the air mover speed may be lowered to cause a longer run time and decrease the humidity. A command may be generated based on the determined adjustment and sent to the appropriate controller (e.g., over a communication link).

Once an adjustment for a rack environmental control has been determined or if the environment in the racks is acceptable, then the flow may include determining whether the environment in the module is acceptable (operation 616). The environment in the module may, for example, not be acceptable if an environmental condition is out of an acceptable range. If the environment in the module is acceptable, then the flow may include continuing to monitor the operating conditions in the racks and the module (operation 604).

If, however, the environment in the module is not acceptable, then the flow may include determining whether there are any racks available to perform an adjustment to the module environment (operation 620). For example, if the module environment is too hot, the environmental control systems of the racks may be evaluated to determine which, if any, have extra cooling capacity. If no racks have the ability to perform an adjustment to the module environment, then the flow may include continuing to monitor the operating conditions in the racks and the module (operation 604).

If, however, one or more racks are available to perform an adjustment to the module environment, the flow may include selecting the rack(s) (operation 624). For instance, if a number of racks are available to perform an adjustment, the rack(s) that have the largest current excess capacity may be used. In particular implementations, the scheduled use of the electronic equipment in the racks may also be taken into account. For example, if the workload of a rack is expected to increase soon (e.g., based on historical data), it may not be selected. In certain modes of operation, multiple racks may be used to provide the adjustment.

Once the appropriate rack(s) have been selected, the flow may include determining an adjustment for the rack(s) egress ports (operation 628). The appropriate operation may, for example, be to increase the size of the egress ports (e.g., if the module environment is too hot) or to decrease the size of the egress ports (e.g., if the module environment is too cold). A command may be generated based on the adjustment and communicated to an actuator for the egress ports (e.g., over a communication link).

The flow may also include determining an adjustment for the air conditioning systems for the selected rack(s) (operation 632). For instance, if the egress ports are being made larger (e.g., because the module environment is too hot), the cooling power in the rack may be increased (e.g., by increasing airflow and/or decreasing coolant temperature). Increasing the cooling power to the module by opening an egress port may, for example, reduce the cooling power for the electronic equipment in the rack. As another example, if the egress port is being made smaller, the cooling power in the rack may be decreased. Decreasing the cooling power to the module by reducing the size of the egress port may, for example, increase the cooling power for the electronic equipment in the rack. The adjustment to the environmental control(s) for the selected rack(s) may be communicated to the appropriate components through an electronic command (e.g., over a communication link). Process 600 may also include continuing to monitor the operating conditions in the racks and the module (operation 604).

Although FIG. 6 illustrates one example of a process for controlling the environment of a module housing racks of electronic equipment, other processes for controlling the environment of such a structure may include fewer, additional, and/or a different arrangement of operations. For example, a process may include adjusting the ingress ports for a rack instead of the egress ports. Additionally, a process may include adjusting the ingress ports and the egress ports. As another example, a process may include a manual adjustment of the airflow through the ports (i.e., ingress and/or egress) with adjustments being made by the environmental control computer to keep the internal environment at the appropriate level. That is, the environmental control computer may react to a manual adjustment of one or more ports without directly sensing that it has happened.

Moreover, the flowcharts and block diagrams in the figures illustrate the architecture, functionality, and operation of systems, methods, and computer program products of various implementations of the disclosure. In this regard, each block in the flowchart or block diagrams may represent a module, segment, or portion of code, which can include one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or the flowchart illustration, and combination of blocks in the block diagrams and/or flowchart illustration, can be implemented by special purpose hardware-based systems that perform the specified function or acts, or combinations of special purpose hardware and computer instructions.

As can be appreciated, aspects of the present disclosure may be implemented as a system, method, or computer program product. Accordingly, aspects of the present disclosure may take the form of an entirely hardware environment, an entirely software embodiment (including firmware, resident software, micro-code, etc.), or an implementation combining software and hardware aspects that may all generally be referred to herein as a "circuit," "module," or "system." Furthermore, aspects of the present disclosure may take the form of a computer program product embodied in one or more non-transitory computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure, a computer readable storage medium may be a tangible medium that can contain or store a program for use by or in connection with an instruction execution system, apparatus, or device.

A computer readable signal medium may include a propagated data signal with computer readable program code embodied therein, for example in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a non-transitory computer readable medium may be transmitted using any medium, including but not limited to wireless, wireline, optical fiber cable, RF, etc., or any suitable combination of the foregoing. Computer program code for carrying out operations for aspects of the disclosure may be written in any combination of one or more programming languages such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosure are described with reference to flowchart illustrations and/or block diagrams of methods, apparatus (systems), and computer program products according to implementations. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other device to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions that execute on the computer or other programmable apparatus provide processes for implementing the functions/acts specified in the flowchart and/or block diagram block or blocks.

The terminology used herein is for the purpose of describing particular implementations only and is not intended to be limiting. As used herein, the singular form "a", "an", and "the" are intended to include the plural forms as well, unless the context clearly indicates otherwise. It will be further understood that the terms "comprises" and/or "comprising," when used in the this specification, specify the presence of stated features, integers, steps, operations, elements, and/or components, but do not preclude the presence or addition of one or more other features, integers, steps, operations, elements, components, and/or groups therefore.

The corresponding structure, materials, acts, and equivalents of all means or steps plus function elements in the claims below are intended to include any structure, material, or act for performing the function in combination with other claimed elements as specifically claimed. The description of the present implementations has been presented for purposes of illustration and description, but is not intended to be exhaustive or limited to the implementations in the form disclosed. Many modifications and variations will be apparent to those of ordinary skill in the art without departing from the scope and spirit of the disclosure. The implementations were chosen and described in order to explain the principles of the disclosure and the practical application and to enable others or ordinary skill in the art to understand the disclosure for various implementations with various modifications as are suited to the particular use contemplated.

A number of implementations have been described for controlling the environment for a module housing electronic equipment racks, and several others have been mentioned or suggested. Moreover, it should be recognized that a variety of additions, deletions, modifications, and substitutions may be made to these implementations while still achieving control of the environment for a module housing electronic equipment racks. Thus, the scope of the protected subject matter should be judged based on the following claims, which may capture one or more aspects of one or more implementations.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A system, comprising:
    at least one rack for electronic equipment, each rack including:
        at least one sensor to measure an environmental condition,
        an air conditioning system comprising a plurality of air movers disposed within a hot aisle inside the rack,
        an ingress port to allow air to flow into the rack from an environment surrounding the rack, and
        an egress port to allow air to flow out of the rack and into the environment surrounding the rack; and
    a housing that surrounds the rack and that defines the environment surrounding the rack, wherein the air that flows out through the egress port of the rack conditions the air in the environment surrounding the rack.

2. The system of claim 1, wherein a size of the egress port is adjustable.

3. The system of claim 1, wherein the egress port comprises one or more apertures.

4. The system of claim 1, further comprising:
an environmental control system configured to increase a cooling power for the rack when the egress port is made larger.

5. The system of claim 1, wherein the air conditioning system further comprises a coolant flow conduit.

6. The system of claim 1, further comprising:
an environmental control system configured to monitor environmental conditions, and to adjust the egress port based on the environmental conditions that were monitored.

7. The system of claim 1, wherein egress ports on a number of racks assume a closed position, forcing airflow through a limited number of racks.

8. The system of claim 1, wherein the ingress port is provisioned on top of the rack and is open by default.

9. The system of claim 1, wherein a size of the ingress port is adjustable.

10. The system of claim 1, wherein the air conditioning system is configured to produce a cooling power that can be increased when the ingress port is made larger.

11. The system of claim 1, further comprising:
an environmental control system configured to monitor environmental conditions, and to adjust the ingress port based on the environmental conditions that were monitored.

12. The system of claim 1, wherein ingress ports on a number of racks assume a closed position, forcing a limited number of racks to cool the environment.

13. The system of claim 1, wherein the egress port is provisioned at the bottom of the rack.

14. The system of claim 1, wherein at least some racks contribute different amounts of cooling to the environment surrounding the racks.

15. A method, comprising:
monitoring environmental conditions in at least one rack for electronic equipment;
altering speeds of a plurality of air movers disposed within a hot aisle inside the rack to selectively change air flow rate within the rack;
adjusting at least one rack port based on the environmental conditions that were monitored; and
adjusting an air conditioning system based on the adjustment to the rack port, wherein air that flows out through egress ports of the racks conditions air of an environment defined by a housing that surrounds the racks.

16. The method of claim 15, wherein the air conditioning system is configured to produce cooling power, and wherein an amount of cooling power for a corresponding rack is adjusted when a size of an associated port is adjusted.

17. The method of claim 16, further comprising:
increasing a cooling power for a number of the racks when a different one of the racks is not able to cool itself.

18. The method of claim 15, further comprising:
selecting one or more of the racks for which to adjust the rack port.

19. The method of claim 15, further comprising:
forcing a limited number of the racks to cool the environment by closing certain ports on a different set of the racks.

20. Non-transitory computer readable storage media encoded with software comprising computer executable instructions for performing operations, comprising:
monitoring environmental conditions in at least one rack for electronic equipment;
altering speeds of a plurality of air movers disposed within a hot aisle inside the rack to selectively change air flow rate within the rack;
adjusting at least one rack port based on the environmental conditions that were monitored; and
adjusting an air conditioning system based on the adjustment to the rack port, wherein air that flows out through egress ports of the racks conditions air of an environment defined by a housing that surrounds the racks.

* * * * *